(12) United States Patent
Lee et al.

(10) Patent No.: US 10,913,072 B2
(45) Date of Patent: Feb. 9, 2021

(54) PARTIAL DISMANTLING DEVICE OF PHOTOVOLTAIC MODULE

(71) Applicant: KOREA INSTITUTE OF ENERGY RESEARCH, Daejeon (KR)

(72) Inventors: Jin-seok Lee, Sejong-si (KR); Young-soo Ahn, Daejeon (KR); Gi-hwan Kang, Sejong-si (KR)

(73) Assignee: Korea Institute of Energy Research, Daejeon (KR)

( * ) Notice: Subject to any disclaimer, the term of this patent is extended or adjusted under 35 U.S.C. 154(b) by 313 days.

(21) Appl. No.: 15/808,018

(22) Filed: Nov. 9, 2017

(65) Prior Publication Data

US 2018/0133720 A1     May 17, 2018

(30) Foreign Application Priority Data

Nov. 11, 2016  (KR) .......................... 10-2016-0150185

(51) Int. Cl.

| | | |
|---|---|---|
| B02C 23/30 | (2006.01) | |
| H01L 31/18 | (2006.01) | |
| B02C 23/10 | (2006.01) | |
| B02C 23/38 | (2006.01) | |
| B02C 25/00 | (2006.01) | |
| B02C 4/02 | (2006.01) | |
| B04C 5/26 | (2006.01) | |
| H01L 31/048 | (2014.01) | |

(52) U.S. Cl.
CPC ............... *B02C 23/30* (2013.01); *B02C 4/02* (2013.01); *B02C 23/10* (2013.01); *B02C 23/38* (2013.01); *B02C 25/00* (2013.01); *B04C 5/26* (2013.01); *H01L 31/048* (2013.01); *H01L 31/18* (2013.01)

(58) Field of Classification Search
CPC ................ B02C 4/02; B02C 4/04; B02C 4/32
See application file for complete search history.

(56) References Cited

U.S. PATENT DOCUMENTS

| | | | |
|---|---|---|---|
| 2011/0031336 A1* | 2/2011 | Stevens ................... | B03B 9/061 241/23 |
| 2015/0158137 A1* | 6/2015 | Mori ....................... | B24B 7/228 451/73 |

FOREIGN PATENT DOCUMENTS

| | | | |
|---|---|---|---|
| CN | 106000575 A | * | 10/2016 |
| JP | 1995-314446 A | | 12/1995 |
| JP | 2004209365 A | * | 7/2004 |
| JP | 2014-054593 A | | 3/2014 |
| JP | 2015-192942 A | | 11/2015 |
| JP | 2015192942 A | * | 11/2015 |
| JP | 5938309 B2 | * | 6/2016 |
| JP | 5938309 B2 | | 6/2016 |

(Continued)

*Primary Examiner* — Shelley M Self
*Assistant Examiner* — Jared O Brown
(74) *Attorney, Agent, or Firm* — Rabin & Berdo, P.C.

(57) ABSTRACT

Disclosed is a partial dismantling device of a photovoltaic module capable of classifying and collecting the photovoltaic module for recycling the photovoltaic module which includes: a transfer unit for transferring a photovoltaic module; a grind unit provided with a plurality of grinders in multiple levels, to grind the element layers of a grinding region into particles of collectible forms; and a suction unit provided with a plurality of inhalers respectively corresponding to the plurality of grinders, to classify the particles pulverized by the grind unit and to inhale the same.

11 Claims, 5 Drawing Sheets

(56) References Cited

FOREIGN PATENT DOCUMENTS

KR 10-0374983 B1 3/2003
WO WO-2013057035 A1 * 4/2013 ............. B03B 9/062

* cited by examiner

PARTIAL DISMANTLING DEVICE OF PHOTOVOLTAIC MODULE

FIELD OF THE INVENTION

The present invention relates to a partial dismantling device of a photovoltaic module for recycling the photovoltaic module.

BACKGROUND OF THE INVENTION

A photovoltaic cell as a basic unit for a crystalline photovoltaic module is an element which can be easily damaged. Therefore, the photovoltaic cell is generally modularized within a rigid aluminum frame to be protected against external forces or bad weather conditions. The photovoltaic module is a product prepared in a single photovoltaic panel form, by laminating element layers such as a tempered glass, a filler, a photovoltaic cell, a back sheet and the like, followed by connecting cables and a switch board.

The photovoltaic module includes a plurality of photovoltaic cells which are connected in series or in parallel so as to be used as a basic unit for the solar power generation. The photovoltaic module may be categorized into a crystalline photovoltaic module (the first generation), a thin-film photovoltaic module (the second generation), and the third generation photovoltaic module. The crystalline photovoltaic module using silicon as a main material is most widely used in recent years. Such photovoltaic module needs to be discarded as time elapse due to reduced efficiency or the like. In this case, useful elements within the photovoltaic module may be collected and recycled, so as to preserve resources and prevent the environmental pollution.

In relation to this, as a conventional art for a method for recycling a waste photovoltaic module, the document Japanese Patent No. 5938309 (hereinafter, 'the prior art') discloses a device comprising a metal grinder for grinding a photovoltaic cell, a collection hood for collecting a pulverized output, and a sensor for measuring a content of metal components, so as to identify and collect useful metals or hazardous metals included in a glass substrate of a photovoltaic panel. The prior art classifies the pulverized output of the photovoltaic cell based on metal components data received by a solenoid valve from sensors.

In a recycling process of the photovoltaic module, the recycled elements generally includes an aluminum frame, a tempered glass, a material within the photovoltaic cell, or a copper wire connected to elements within the photovoltaic cell. Accordingly, the recycling process of the photovoltaic module may be improved in efficiency when the elements can be separated by identifying the elements in a dismantling step, compared to a process of classifying elements after dismantling of an entire module in the recycling process in the photovoltaic module.

Furthermore, the front glass substrate of the photovoltaic module may be damaged depending on the conditions of using or removing the photovoltaic module. In this case, despite of crack on the glass substrate, the photovoltaic module shape may be maintained by the stacking of films while inputting to the partial dismantling device for recycling. However, when the photovoltaic module is separated using a rotary brush irrespective of the element layer types, the film of the photovoltaic cell will be removed without maintaining the shape of the photovoltaic module, causing failure in partially dismantling the photovoltaic module, and causing damages on a dismantling device as glass pieces are introduced to the dismantling device.

SUMMARY OF THE INVENTION

An object of the present invention is to provide a partial dismantling device for separating, collecting and classifying elements of a photovoltaic module among integrated elements of the photovoltaic module in a single process at a grinding step.

Another object of the present invention is to provide the partial dismantling device for additionally classifying the collected particles so as to effectively select a reusable component of the photovoltaic module.

Still another object of the present invention is to provide the partial dismantling device capable of recycling the photovoltaic module having damaged glass substrate.

To achieve the above objects, the present invention provides a partial dismantling device of a photovoltaic module, comprising: a transfer unit for transferring a photovoltaic module; a sensor unit for distinguishing grinding heights of the photovoltaic module arranged on the transfer unit; a grind unit provided with a plurality of grinders in multiple levels, to grind the element layers of a grinding region into particles of collectible forms; and a suction unit provided with a plurality of inhalers respectively corresponding to the plurality of grinders, to classify the particles pulverized by the grind unit and to inhale the same.

Preferably, the sensor unit may measure heights of a back sheet layer of the photovoltaic module and a cell layer coupled to a lower portion of the back sheet layer, as being arranged at an upper periphery of a region on which the photovoltaic module is arranged within the transfer unit.

Preferably, the sensor unit defines the grinding region as the back sheet layer of the photovoltaic module and the cell layer coupled to the lower portion of the back sheet layer, as being arranged at the upper periphery of the region on which the photovoltaic module is arranged within the transfer unit.

Preferably, the sensor unit may define the grinding region, by measuring a height of a lower glass substrate among the element layer of the photovoltaic module.

Preferably, the partial dismantling device of the photovoltaic module may further comprise a cooling unit for cooling down frictional heat generated when the grind unit grinds the element layer of the grinding region into a collectable particle form.

Preferably, the grind unit may comprise, a first grinder for grinding the back sheet layer adhered to an upper portion of the photovoltaic module; and a second grinder for grinding the cell layer coupled to the lower portion of the back sheet layer.

Preferably, the photovoltaic module introduced to the grind unit may have an uneven shape surface of the cell layer, and the first grinder may simultaneously grind the back sheet layer and a part of the EVA film coming into contact with the lower portion of the back sheet layer, so as to leave no back sheet layer at recessed portions of the cell layer.

Preferably, the grind unit may have a lower surface of the first grinder and a lower surface of the second grinder which are spaced apart by a distance smaller than a height of the cell layer.

Preferably, the second grinder may grind the cell layer to allow collection of a mix of copper ribbon particles immersed in the cell layer, cell integrated element particles, and EVA film particles in the cell layer.

Preferably, the second grinder may grind the cell layer by driving at a height higher than a glass substrate forming a lower portion of the photovoltaic module so as to leave the EVA film on top of the glass substrate.

Preferably, the suction unit may comprise, a first inhaler for inhaling the back sheet layer particles and the EVA film particles pulverized by the first grinder; and a second inhaler for inhaling the cell layer particles including the copper ribbon particles, the cell integrated element particles, and the EVA film particles pulverized by the second grinder.

Preferably, the plurality of grinders may further comprise the classifying unit for classifying particles pulverized by the second grinder, and the classifying unit comprises a first cyclone for extracting the EVA film particles among the particles inhaled by the second inhaler, and discharging the copper ribbon particles and the cell integrated element particles; and a second cyclone connected to an outlet of the first cyclone for classifying the copper ribbon particles and the cell integrated element particles.

Preferably, the sensor unit may measure a height of the glass substrate, the second grinder arranged on the transfer unit grinds the EVA film arranged on the glass substrate to leave the glass substrate, and the inhaler corresponding to the second grinder arranged on the transfer unit inhales the pulverized EVA film particles.

Preferably, the partial dismantling device of the photovoltaic module may further comprising a spraying unit for spraying water to a region between the grinder and the photovoltaic module The present invention provides the partial dismantling device of the photovoltaic module capable of dismantling the photovoltaic module for recycling the photovoltaic module. More specifically, the partial dismantling device of the photovoltaic module according to the present invention is capable of precisely defining a grinding region using the sensor unit, and separating the waste (the first grinder+the first suction unit) and recovered material (the second grinder+the second suction unit) of the photovoltaic module in a single process using multiple level grinders arranged on the predefined grinding region.

Additionally, the partial dismantling device of the photovoltaic module of the present invention is capable of additionally performing a detailed classification by the classifying process of the classifying unit comprising a plurality of cyclones. More particularly, the grinding process of the first grinder may classify the back sheet layer. Therefore, there is an advantage of allowing the subsequent classifying process of the classifying unit after sorting the back sheet layer to easily classify the copper ribbon, the cell integrated element, and the EVA film.

Additionally, according to the present invention, the grind unit is driven at a height higher than the glass substrate forming a lower portion of the photovoltaic module so as to leave the EVA film for preventing bouncing of damaged glass pieces.

Thereby, the present invention may improve the efficiency in the subsequent classifying process of the photovoltaic module particles in the classifying unit, and the partial dismantling device of the photovoltaic module may be applied to a module having a damaged glass substrate with an advantage in applying to a broader scope for recycling targets.

BRIEF DESCRIPTION OF THE DRAWINGS

Embodiments of the invention will now be described with reference to the accompanying drawings, in which.

DETAILED DESCRIPTION OF THE INVENTION

Figure 1:
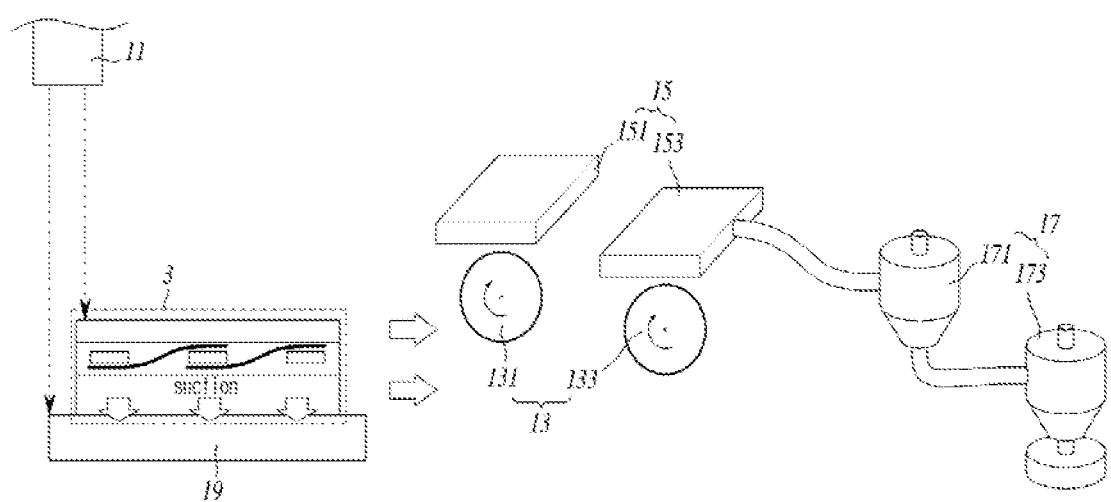
FIG. 1 shows a partial dismantling device of a photovoltaic module according to an embodiment of the present invention.

Hereinafter, the present invention will be described in detail with reference to the accompanying drawings. However, the present invention is not limited or restricted by exemplary embodiments. The same reference numerals represented in each of the drawings indicate the elements or the components that perform substantially the same functions.

The object and effect of the present invention will be understood naturally or be apparent by the following description, but is not limited only to the following description. In addition, a detailed description about the well known technology which may obscure the gist of the present invention unnecessarily may be omitted.

FIG. 1 shows a partial dismantling device of a photovoltaic module 1 according to an embodiment of the present invention. The partial dismantling device 1 of the photovoltaic module is provided to classify element layers of a photovoltaic module 3 and collect the same for recycling.

The partial dismantling device 1 of the photovoltaic module according to an embodiment of the present invention may be applied to a crystalline photovoltaic module (the first generation), a thin-film photovoltaic module (the second generation), and the third generation photovoltaic module.

Referring to FIG. 1, the partial dismantling device 1 of the photovoltaic module may comprise a sensor unit 11, a grind unit 13, a cooling unit (not shown), a suction unit 15, a classifying unit 17, and a transfer unit 19.

The photovoltaic cell is provided to generate electricity by the photovoltaic effect by receiving lights as a system for generating power by the element storing the electrical energy with a collector panel, a capacitor, a power converter and the like. As the photovoltaic cell is a basic unit connected in series and in parallel, a commercial product is made as the photovoltaic module 3 with rigid material and structure to avoid influences from natural conditions including the climate. In particular, the photovoltaic module 3 refers to a device comprising a cell (solar cell) as a basic unit for the photovoltaic cell, an external frame for protecting the photovoltaic cell, a filler and the like. The photovoltaic module 3 according to an embodiment of the present invention may be transported as being loaded on the transfer unit 19.

The sensor unit 11 is capable of defining a grinding region by measuring a height of an element layer of the photovoltaic module 3. The method for measuring the height by the sensor unit 11 may include various methods such as an x-ray measurement, an ultrasonic wave measurement, a physical height measurement or the like, but is not limited thereto. In the embodiment, the sensor unit 11 may use a contacting or non-contacting thickness measuring device. The method for measuring a thickness by the sensor unit 11 may include various methods such as an ultrasonic wave thickness measurement, a laser thickness measurement, a contacting type measurement or the like. The sensor unit 11 may be provided at an periphery of a region on which the photovoltaic module is arranged in the transfer unit 19. The sensor unit 11 located on an upper portion of the photovoltaic module 3 may measure a thickness of the entire photovoltaic module 3 or a thickness of the glass substrate (35, FIG. 2).

Figure 2:
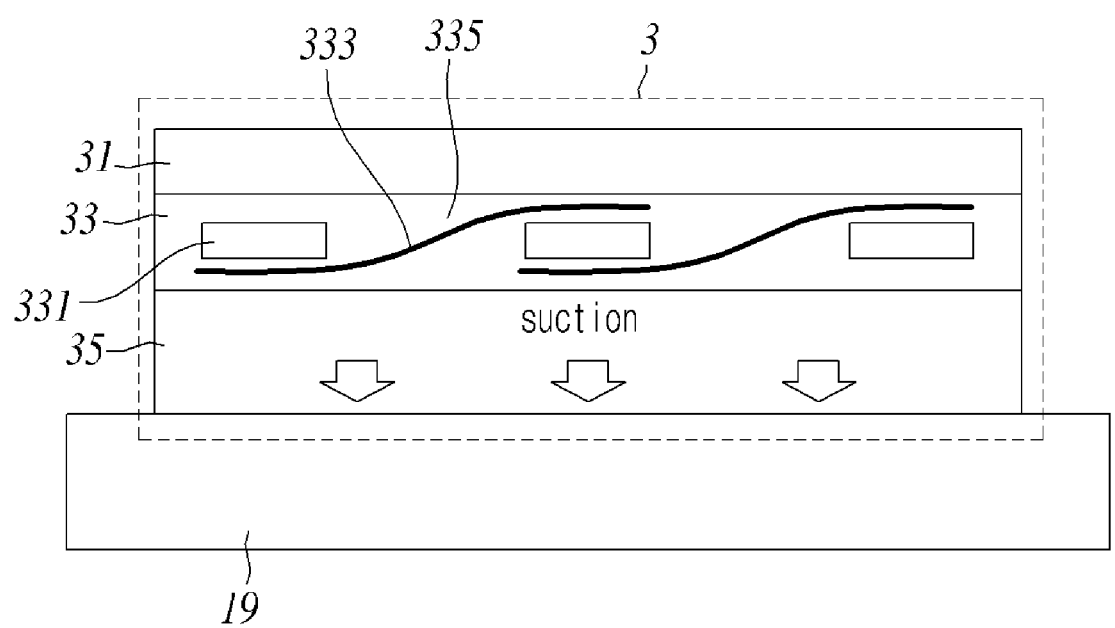
FIG. 2 shows a photovoltaic module and a transfer unit for fixing the photovoltaic module in the partial dismantling device of the photovoltaic module of FIG. 1.

The sensor unit 11 may measure heights of a back sheet layer (31, FIG. 2) adhered to an upper portion of the photovoltaic module 3 and a cell layer (33, FIG. 2) coupled to a lower portion of the back sheet layer (31, FIG. 2). In the embodiment, the sensor unit 11 measures the height for properly setting the grind unit 13 described as follows. The grind unit 13 set to the predefined height measured by the sensor unit 11 grinds and dismantles the element layer at the corresponding height.

The sensor unit 11 is capable of defining the grinding region as the back sheet layer (31, FIG. 2) adhered to the upper portion of the photovoltaic module and the cell layer (33, FIG. 2) coupled to the lower portion of the back sheet layer (31, FIG. 2). More specifically, the waste photovoltaic modules 3 may have varied sizes, and thus the sensor unit 11 may define an offset of the grinding region by measuring the height of the element layer when treating the photovoltaic module 3. More specifically, in the embodiment, the measured height becomes the reference for defining the grinding region, allowing a first grinder 131 to separate the back sheet layer (31, FIG. 2) from the cell layer (33, FIG. 2). Thereby, the efficiency can be increased in a classifying process performed in the subsequent classifying unit 17.

The sensor unit 11 may define the grinding region, by measuring the height of a lower glass substrate (35, FIG. 2) among the element layer of the photovoltaic module 3.

The back sheet layer (31, FIG. 2) located on top of the photovoltaic module 3 may be provided at 600 μm to 1000 μm above a top surface of the glass substrate (35, FIG. 2). In the embodiment, the back sheet layer (31, FIG. 2) is adhered by a bottom surface at the height of 700 μm to 900 μm from the top surface of the glass substrate (35, FIG. 2), with a top surface of the back sheet layer located at the height of 1000 μm to 1400 μm. The thickness of the back sheet layer (31, FIG. 2) may be in a range of 300 μm to 500 μm.

The cell layer (33, FIG. 2) comes into contact with the lower portion of the back sheet layer (31, FIG. 2). The thickness of the cell layer (33, FIG. 2) may be in a range of 600 μm to 1000 μm from the top surface of the glass substrate (35, FIG. 2). In the embodiment, the cell layer (33, FIG. 2) is formed at a height of 600 μm to 800 μm from the top surface of the glass substrate (35, FIG. 2), comprising EVA film (335, FIG. 2), cell integrated element (331, FIG. 2) having a thickness of 100 μm to 300 μm within the EVA film (335, FIG. 2), and copper ribbon (333, FIG. 2).

FIG. 2 shows a photovoltaic module 3 and a transfer unit 19 for fixing the photovoltaic module 3 in the partial dismantling device 1 of the photovoltaic module.

Referring to FIG. 2, the photovoltaic module 3 according to an embodiment of the present invention may comprise the back sheet layer 31, the cell layer 33, and the glass substrate 35. The cell layer 33 may come in contact with the lower portion of the back sheet layer 31. The glass substrate 35 may come in contact with the lower portion of the cell layer 33. The cell layer 33 may comprise the cell integrated element 331, the copper ribbon 333, and the EVA film 335.

The sensor unit 11 may define a first height as the height from a top surface of the transfer unit 19 to a top surface of the cell layer 33. The sensor unit 11 may set a minimum value of the first height to be higher than the cell integrated element 331. Accordingly, the sensor unit 11 may set to prevent the first grinder 131 to be described in the following section from grinding the cell integrated element 331 and the copper ribbon 333, while removing a portion of the EVA film 335 on an upper part of the cell layer 33.

The sensor unit 11 may define a second height as the height from the top surface of the transfer unit 19 to a top surface of the glass substrate 35. The sensor unit 11 may set a minimum value of the second height to be in a range of 180 μm 350 μm. The sensor unit 11 may set the second height so as to protect the glass substrate 35 by leaving a predefined thickness of the lower EVA film 335 in the cell layer 33. The sensor unit 11 may set a maximum value of the second height to be smaller than the height of the lower surface of the cell integrated element 331. Accordingly, the sensor unit 11 may set the second height to prevent a second grinder 133 to be described in the following section from grinding the glass substrate 35, while remaining a portion of the EVA film 335.

The sensor unit 11 may define a first grinding region as the region of the photovoltaic module 3 placed higher than the first height. The sensor unit 11 may define a second grinding region as the region of the photovoltaic module 3 placed higher than the second height and lower than the first height. The sensor unit 11 may set the height of the first grinder 131 to be the first height. The sensor unit 11 may set the height of the second grinder 133 to be the second height.

The transfer unit 19 may fix the photovoltaic module 3 by a suction or a jig, and move toward the grind unit 13 along with the photovoltaic module 3. The transfer unit 19 may be understood as an assembly line for transferring a product toward the grinder.

The transfer unit 19 may fix the photovoltaic module 3 by the suction. The transfer unit 19 is formed with holes on an adhering surface coming into contact with the photovoltaic module 3 so as to strongly adsorb the photovoltaic module 3 by the air inhaling and the suction. A plurality of holes may be provided on the surface of the transfer unit 19. The photovoltaic module 3 adsorbed to the transfer unit 19 by the suction may prevent slipping during the grinding process.

Additionally, the transfer unit 19 may emit a part of frictional heat of the photovoltaic module 3 made from the friction of the grind unit 13 through the suction. The photovoltaic module 3 after emitting the frictional heat may decrease the viscosity of particles formed during the grinding by the grind unit 13, so as to prevent deterioration in functions of the suction unit 15 and the classifying unit 17.

The transfer unit 19 may have the jig on an upper part in order to replace and support the suction function. The jig may fix the photovoltaic module 3 on the transfer unit 19. The jig may have various forms such as a rectangular frame, a pin, a control gauge and the like in order to fix the photovoltaic module 3. When the photovoltaic module 3 is not fixed to the transfer unit 19 by the jig, there is possibility of slipping of the photovoltaic module 3 in the process of partially grinding the photovoltaic module 3 by the grinder. In this case, the grinding of the waste photovoltaic module 3 cannot be performed in a precise manner. According to the embodiment of the present invention, the jig is capable of improving the grinding function of the grind unit 13 by fixing the photovoltaic module 3 on the transfer unit 19, so as to prevent the slipping phenomenon of the photovoltaic module 3.

Figure 3:
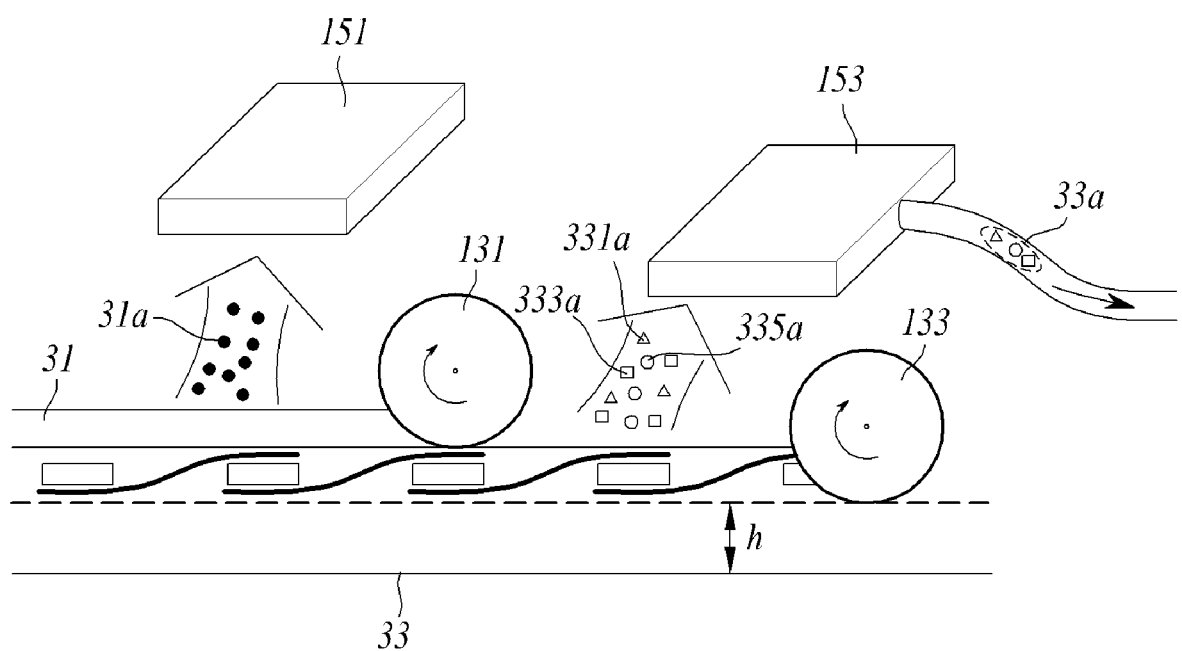
FIG. 3 is a schematic view to describe a driving process of a grind unit and a suction unit in the partial dismantling device of the photovoltaic module of FIG. 1.

FIG. 3 is a schematic view to describe a driving process of the grind unit 13 and the suction unit 15 in the partial dismantling device 1 of the photovoltaic module.

Referring to FIG. 3, the grind unit 13 is provided with a plurality of grinders in multiple levels to sort and grind the different types of element layers, so as to grind the element layers of the grinding region into collectable particle formats. The grind unit 13 may comprise the first grinder 131 for grinding the back sheet layer 31 adhered to the upper portion of the photovoltaic module 3 and the second grinder 133 for grinding the cell layer 33 coupled to the lower portion of the back sheet layer 31.

In the embodiment, a rotation direction of the grind unit 13 may be set to allow easy inhaling of the pulverized particles of the photovoltaic module 3 into the suction unit 15.

The rotation direction of the grind unit 13 may be set in a direction of elevating the pulverized particles after grinding the element layer of the photovoltaic module 3 for the easy inhaling. In the embodiment, the grind unit 13 may rotate in a clockwise direction when the photovoltaic module 3 approaches from left side. In the embodiment, the grind unit 13 may rotate in a counterclockwise direction when the photovoltaic module 3 approaches from right side.

The grind unit 13 is capable of grinding the photovoltaic module 3 using rotation and friction. The grind unit 13 may have a structure for maximizing the friction with the photovoltaic module 3 during the grinding. In the embodiment, the grind unit 13 may be provided in various types in order to maximize the friction with the photovoltaic module 3 during the process. In particular, the grind unit 13 may be all types such as a grinder, a roller, a brush, an abrader, a file, a chain and the like, which are capable of performing the grinding function simultaneously with rotating or reciprocating.

The photovoltaic module 3 introduced to the grind unit 13 has an uneven shape surface of the cell layer 33. The first grinder 131 may simultaneously grind the back sheet layer 31 and a part of the EVA film 335 coming into contact with the lower portion of the back sheet layer 31, so as to leave no back sheet layer 31 on recessed portions of the cell layer 33.

In the embodiment, the integration between the lower portion of the back sheet layer 31 and the upper portion of the cell layer 33 may form a curved surface, instead of a flat surface. Thereby, when the first grinder 131 of the grind unit 13 grinds the back sheet layer 31, a part of the cell layer 33 coupled to the lower portion thereof may be ground simultaneously with the grinding.

The grind unit 13 may have a multiple level structure of integrating the first grinder 131 and the second grinder 133 with a lower surface of the first grinder 131 and a lower surface of the second grinder 133 spaced apart by a distance smaller than the height of the cell layer 33. The grind unit 13 may grind and separate different types of element layers of the photovoltaic module 3 in a single process.

The grinding process as a single process has an advantage of increasing the dismantling efficiency of the partial dismantling device 1 of the photovoltaic module. The grinding region determined by the sensor unit 11 refers to the grinding region of the first grinder 131 and the second grinder 133 constituting the grind unit 13.

The first grinder 131 and the second grinder 133 may have a structure integrated in multiple levels. The first grinder 131 and the second grinder 133 may be provided to drive in an identical rotation direction.

The first grinder 131 may be set on a location of the first height from the transfer unit 19. The first grinder 131 may grind the back sheet layer 31 adhered to the upper portion of the photovoltaic module 3. The first grinder 131 may grind the back sheet layer 31 which is the first grinding region. The first grinder 131 may grind the back sheet layer 31 into back sheet layer particles 31a. The back sheet layer particles 31a after grinding may be inhaled to a first inhaler 151. In the process of inhaling the back sheet layer particles 31a to the first inhaler 151, the back sheet layer 31 is entirely removed from the photovoltaic module 3. Additionally, the first grinder 131 may grind a part of the EVA film 335 coming into contact with the lower portion of the back sheet layer 31, simultaneously with grinding the back sheet layer 31. The first grinder 131 may grind a part of the EVA film 335 which is the first grinding region. The first grinder 131 may grind a part of the EVA film 335 into EVA film particles 335a. The EVA film particles 335a after grinding may be inhaled to the first inhaler 151. Accordingly, the cell layer 33 on the lower part of the back sheet layer 31 is exposed, allowing the classifying unit 17 described in the following section to effectively sort complex elements existing in the cell layer 33.

The second grinder 133 may grind the cell layer 33 allowing the suction unit 15 to collect by mixing copper ribbon particles 333a immersed in the cell layer 33, cell integrated element particles 331a, and EVA film particles 335a filled in the cell layer 33.

In the embodiment, the second grinder 133 may be set on a location of the second height from the transfer unit 19. The second grinder 133 may grind the cell layer 33 coupled to the lower portion of the back sheet layer 31. The difference in heights of the first grinder 131 and the second grinder 133 may be smaller than the difference in heights of a top surface and a bottom surface of the cell layer 33. The second grinder 133 may grind the cell layer 33 which is the second grinding region. The second grinder 133 may grind the cell layer 33 into the cell layer particles 33a. The cell layer particles 33a after grinding may include the cell integrated element particles 331a, the copper ribbon particles 333a, and the EVA film particles 335a.

Additionally, the second grinder 133 may grind the cell layer 33 by driving at a height higher than the glass substrate 35 forming a lower portion of the photovoltaic module 3 so as to leave the EVA film 335 on top of the glass substrate 35.

In the embodiment, the second grinder 133 may leave the EVA film 335 by a height value of 'h'. In the embodiment, it is notable that the second grinding region which is left by the second grinder 133 does not include the cell integrated element 331 and the copper ribbon 333. In FIG. 3, the height of the remaining EVA film 335 is denoted as 'h'. The remaining EVA film 335 of 'h' is able to maintain an external shape of the glass substrate 35 placed on the lower portion of the EVA film 335. Therefore, the second grinder 133 may prevent glass pieces from bouncing into the inhalers 151 and 153 or other devices even when the photovoltaic module 3 includes the damaged glass substrate 35 while grinding, thereby allowing to input the photovoltaic module 3 having the damaged glass substrate 35 as a recycling object while protecting an expected lifecycle of the partial dismantling device 1 of the photovoltaic module.

The cooling unit (not shown) may cool down the frictional heat generated when the grind unit 13 grinds the element layers of the grinding region into the collectable particle forms. The cooling unit (not shown) may maintain the temperature of the grind unit 13 at a low level in association with the grind unit 13. Preferably, the cooling unit (not shown) may perform the above function as being provided inside the grind unit 13. In the embodiment, the cooling unit (not shown) may comprise a first cooler (not shown) and a second cooler (not shown). The first cooler (not shown) may operate in association with the first grinder 131. The first cooler (not shown) may be provided at inner or outer side of the first grinder 131. The first cooler (not shown) may cool down the frictional heat generated during the grinding process of the first grinder 131. More preferably, the first cooler (not shown) may be provided inside the first grinder 131 to cool down the first grinder 131 heated during the process so as to improve the process efficiency.

The second cooler (not shown) may operate in association with the second grinder 133. The second cooler (not shown) may be provided at inner or outer side of the second grinder 133. The second cooler (not shown) may cool down the frictional heat generated during the grinding process of the second grinder 133. More preferably, the second cooler (not shown) may be provided inside the second grinder 133 to cool down the second grinder 133 heated during the process so as to improve the process efficiency.

In another embodiment, the cooling unit (not shown) may cool down the frictional heat generated during the process by cooling down the transfer unit 19.

The location and driving range of the cooling unit (not shown) is not limited to the embodiments provided herein, and may comprise all functions and structures capable of cooling down the grind unit 13, the photovoltaic module 3 and the pulverized particles.

According to the embodiment, the frictional heat is inevitably generated since the grind unit 13 removes the back sheet layer 31 and the EVA film 335 by the grinding process. When the frictional heat is generated, viscosity is generated as the polymer such as the EVA film 335 and the back sheet layer 31 is partially molten. Therefore, the cooling unit (not shown) may be required for cooling down the frictional heat in the grinding process, for inhaling the particles of powder type in the recovery process of the suction unit 15. Additionally, the subsequent classifying process in the classifying unit 17 may use the differences in the sizes and the gravities of the particles. Additionally, according to the embodiment, it is further notable that the cooling unit (not shown) for cooling down the frictional heat is provided so as to prevent adhesion or integration of the pulverized particles due to the viscosity.

That is, the cooling unit (not shown) may prevent viscosity generated in the pulverized particles by directly or indirectly cooling down the frictional heat of the pulverized particles and the grind unit 13 and the photovoltaic module 3, and prevent the deterioration of function in the subsequent processes.

The suction unit 15 may have a plurality of inhalers. The suction unit 15 may classify the particles pulverized by the grind unit 13 and inhale the same. The suction unit 15 may transfer the particles to the classifying unit 17. The suction unit 15 may be placed on an upper part of the grind unit 13.

The suction unit 15 may comprise the first inhaler 151 for inhaling the back sheet layer particles 31a and the EVA film particles 335a pulverized by the first grinder 131, and the second inhaler 153 for inhaling the cell layer particles 33a including the copper ribbon particles 333a, the cell integrated element particles 331a, and the EVA film particles 335a pulverized by the second grinder 133.

The first inhaler 151 may inhale the pulverized output of the first grinder 131. The first inhaler 151 may inhale the back sheet particles 31a pulverized by the first grinder 131.

The second inhaler 153 may inhale the pulverized output of the second grinder 133. The second inhaler 153 may inhale the cell layer particles 33a including the copper ribbon particles 333a, the cell integrated element particles 331a, and the EVA film particles 335a pulverized by the second grinder 133, to transfer the same to the classifying unit 17.

In the embodiment, among the pulverized output inhaled by the first inhaler 151, the pulverized output of the back sheet layer 31 may not be included in a reusable material target, and may be discarded. In contrast, the pulverized output inhaled by the second inhaler 153 may be selected as the reusable material target by including only the pulverized output of the cell layer 33. That is, a recycling process for element layers is notable in that the first inhaler 151 separates the discarding target and the second inhaler 153 collects the reusable material target, in a single process by an efficient manner.

Figure 4:
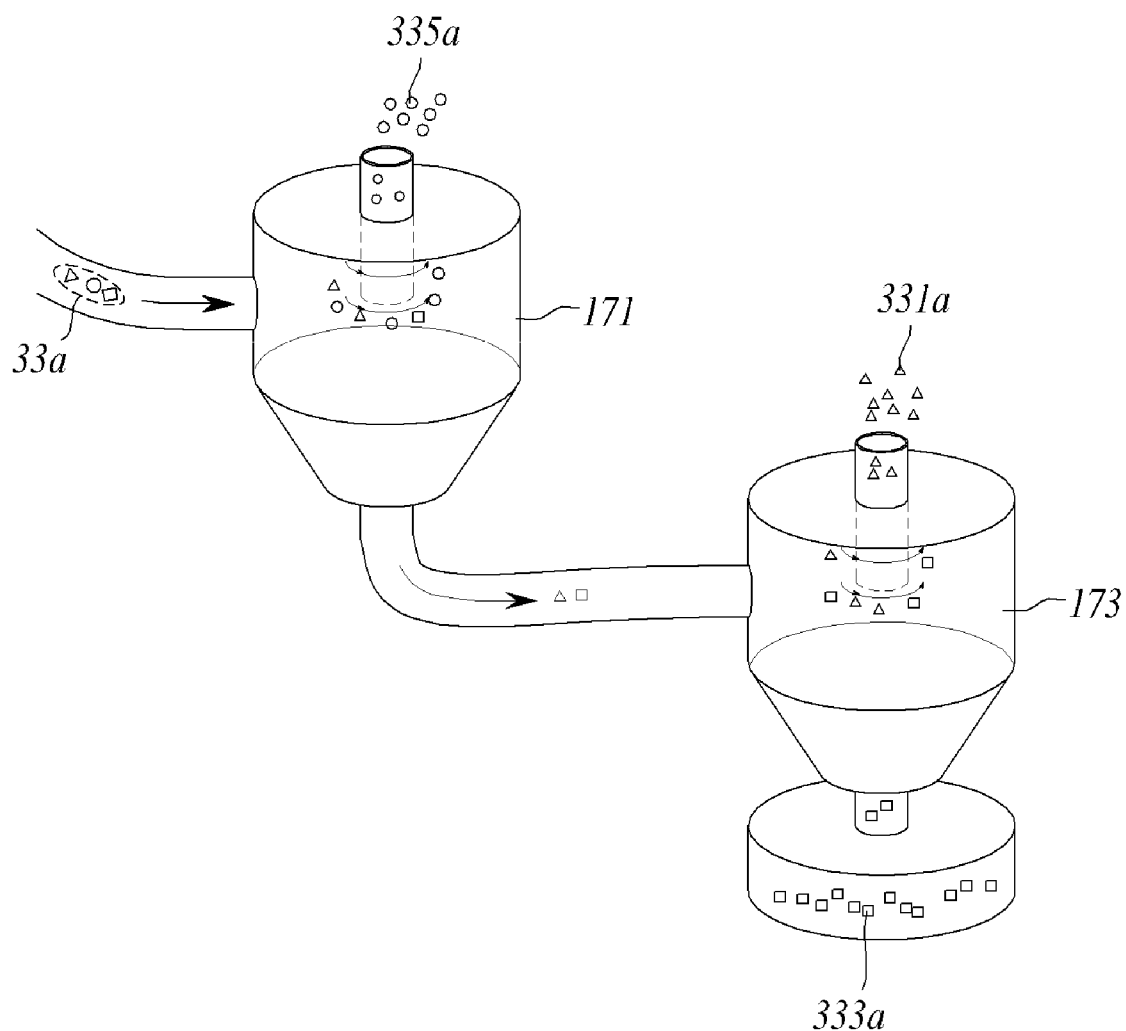
FIG. 4 is a schematic view to describe a classifying process of a classifying unit in the partial dismantling device of the photovoltaic module of FIG. 1.

FIG. 4 is a schematic view to describe a classifying process of the classifying unit 17 in the partial dismantling device 1 of the photovoltaic module of FIG. 1.

Referring to FIG. 4, the classifying unit 17 may sort in detail by categorizing the pulverized particles of the photovoltaic module 3, and classify the particles which inhaled the particles pulverized by the second grinder 133.

The classifying unit 17 may sort the particles pulverized by the grind unit 13 in details. The classifying unit 17 may comprise a first cyclone 171 for extracting the EVA film particles 335a among the particles received from the second inhaler 153 by gravity differences, and discharging the copper ribbon particles 333a and the cell integrated element particles 331a, and a second cyclone 173 connected to an outlet of the first cyclone 171 for classifying the copper ribbon particles 333a and the cell integrated element particles 331a by the gravity differences.

In the embodiment, the classifying unit 17 may comprise a plurality of cyclonic classifying devices, shaking tables, and blow-sorting devices.

The cyclone is a device for separating and collecting from liquid by applying centrifugal force to particles contained in a fluid having a swirl flow. The cyclone may be installed on a rotation blade and the like in the device. The advantage of the cyclone is in that the main body has no driving part compared to other devices using the centrifugal force for mechanically applying the centrifugal force to the particles.

The shaking table may comprise a plane table inclined forwardly and backwardly by about 2° to 5° so as to reciprocate in left and right directions.

The blow-sorting device uses a method for separating solid particles using gravity differences, and it can use the fluid having the gravity greater than 1. Thereby, the blow-sorting device can perform a gravity sorting method of distinguishing a light particle and a heavy particle.

In the embodiment, the classifying unit 17 is provided with the first cyclone 171 and the second cyclone 173. The first cyclone 171 and the second cyclone 173 of the classifying unit 17 may be operated in association to each other. The classifying unit 17 generates a flow of fluid inside the cyclone. The classifying unit 17 may sort the mixed different particles by using the flow of fluid and the gravity differences of the particles. The first cyclone 171 and the second cyclone 173 may include outlets on upper portions respectively, for discharging the sorted particles.

The classifying unit 17 may sort the cell layer particles 33a pulverized by the grind unit 13 in more detail. The classifying unit 17 may sort the received cell layer particles 33a into the copper ribbon particles 333a, the cell integrated element particles 331a, and the EVA film particles 335a, depending on the gravity differences of the particles.

The first cyclone 171 may receive the cell layer particles 33a from the second inhaler 153. The first cyclone 171 may extract the EVA film particles 335a by the gravity differences and discharge the copper ribbon particles 333a and the cell integrated element particles 331a. The first cyclone 171 may extract the EVA film particles 335a through the upper outlet. The first cyclone 171 may discharge the cell integrated element particles 331a and the copper ribbon particles 333a through a lower outlet.

The classifying unit 17 may comprise a connection channel (not shown) to connect the first cyclone 171 and the second cyclone 173. The connection channel may be in a form of pipe connecting the outlet of the first cyclone 171 and an inlet of the second cyclone 173. The connection channel allows a discharged output of the first cyclone 171 to flow into the second cyclone 173.

The second cyclone 173 connected to the outlet of the first cyclone 171 may classify the copper ribbon particles 333a and the cell integrated element particles 331a by the gravity differences. The second cyclone 173 may extract the cell integrated element particles 331a to the upper outlet. The second cyclone 173 may have a storing space at a lower part. The second cyclone 173 may collect the separated copper ribbon particles 333a in the storing space.

The partial dismantling device 1 of the photovoltaic module according to the embodiment of the present invention has the grind unit 13 configured to have a predefined height difference between the first grinder 131 and the second grinder 133, capable of separating the back sheet layer 31 and the EVA film 335 from the photovoltaic module 3 in a single process. The conventional type of the partial dismantling device 1 of the photovoltaic module performs the grinding process using a single grinder, or using a plurality of grinders performing the grinding process in stepwise, resulting in a low efficiency of the process. The partial dismantling device 1 of the photovoltaic module according to the embodiment of the present invention may separate the back sheet layer 31 and the cell layer 33 in a single process, and sort the different types of pulverized particles in more detail and collect the same. Accordingly, the partial dismantling device 1 of the photovoltaic module according to the embodiment of the present invention is capable of performing the grinding process subsequently, thereby reducing unnecessary operation of the assembly line.

Additionally, the partial dismantling device 1 of the photovoltaic module according to the embodiment may further comprise a spraying unit 190 for spraying water to a region between the grinder and the photovoltaic module.

Figure 5:
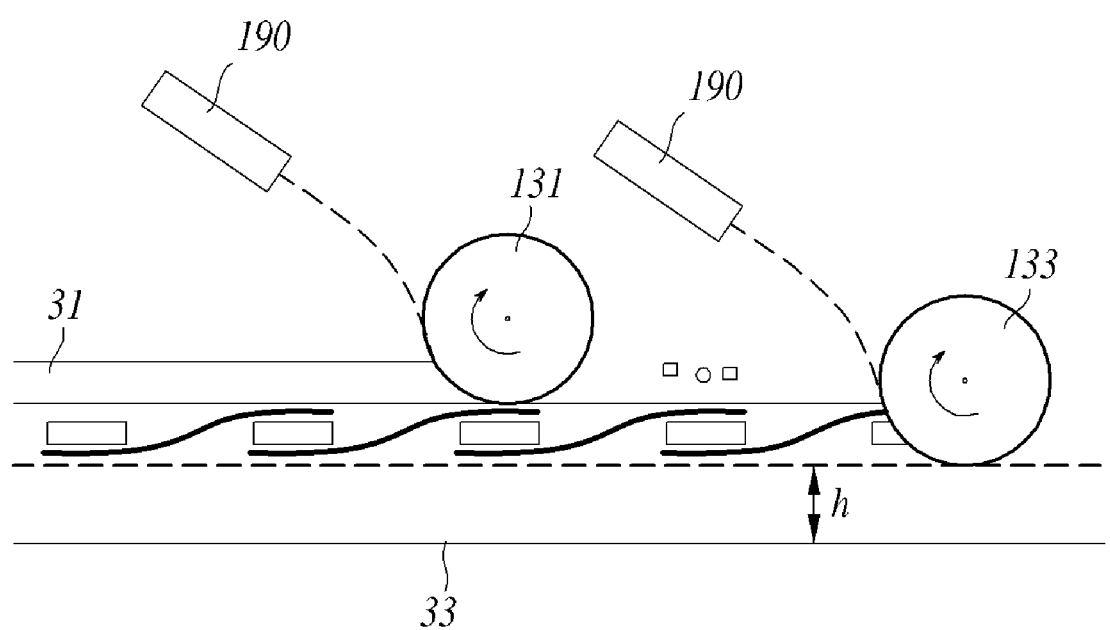
FIG. 5 is a schematic view to describe the partial dismantling device of the photovoltaic module comprising a spraying unit according to an embodiment of the present invention.

FIG. 5 is a schematic view of the spraying unit 190 according to an embodiment of the present invention.

Referring to FIG. 5, the spaying unit 190 may be arranged in a region between a first grinder 131 or a second grinder 133 and the photovoltaic module 3.

Although the present invention has been described by the restricted embodiments and the drawings as described above, the present invention is not limited to the aforementioned embodiments, and various modifications and alterations can be made from the descriptions by those skilled in the art to which the present invention pertains. Accordingly, the scope of the present invention should not be determined by the above-described embodiments, and should be determined by not only the following claims but also their equivalents.

| Reference Numerals | |
|---|---|
| 1: partial dismantling device of photovoltaic module | |
| 11: sensor unit | |
| 13: grind unit | |
| 131: a first grinder | 133: a second grinder |
| 15: suction unit | |
| 151: a first inhaler | 153: a second inhaler |
| 17: classifying unit | |
| 171: a first cyclone | 173: a second cyclone |
| 19: transfer unit | |
| 3: photovoltaic module | |
| 31: back sheet layer | 31a: back sheet layer particles |
| 33: cell layer | 33a: cell layer particles |
| 331: cell integrated element | 331a: cell integrated element particles |
| 333: copper ribbon | 333a: copper ribbon particles |
| 335: EVA film | 335a: EVA film particles |
| 35: glass substrate | |
| 190: spraying unit | |

What is claimed is:

1. A partial dismantling device for a photovoltaic module, comprising:
   a transfer device for transferring a photovoltaic module;
   a grind device provided with a plurality of grinders placed at different heights, to grind element layers of a grinding region into particles of collectible forms; and
   a suction device provided with a plurality of inhalers respectively corresponding to the plurality of grinders, to classify particles pulverized by the grind device and to inhale the pulverized particles,
   wherein the plurality of grinders are disposed to be spaced apart from each other,
   wherein each of the plurality of grinders grinds a different portion of the grinding region,
   wherein the different portions are disposed at different heights from the transfer device,
   wherein the plurality of grinders comprises:
   a first grinder for grinding at least a part of a back sheet layer adhered to an upper portion of the photovoltaic module; and
   a second grinder for grinding at least a part of a cell layer coupled to a lower portion of the back sheet layer,
   wherein the second grinder grinds the at least a part of the cell layer at a height higher than a glass substrate forming a lower portion of the photovoltaic module, so as to leave an ethylene vinyl acetate (EVA) film on a top of the glass substrate, and
   wherein the plurality of inhalers comprise:
   a first inhaler for inhaling the at least a part of the back sheet layer particles and EVA film particles pulverized by the first grinder; and
   a second inhaler for inhaling the at least a part of the cell layer particles including copper ribbon particles, cell integrated element particles, and EVA film particles pulverized by the second grinder.

2. The partial dismantling device for the photovoltaic module according to claim 1,
   further comprising a sensor device for distinguishing grinding heights of the photovoltaic module, wherein the sensor device measures heights of the back sheet layer of the photovoltaic module and the cell layer coupled to a lower portion of the back sheet layer, the sensor device being arranged at a periphery of a region on which the photovoltaic module is arranged within the transfer device.

3. The partial dismantling device for the photovoltaic module according to claim 1,
further comprising a sensor device for distinguishing grinding heights of the photovoltaic module, wherein the sensor device defines the grinding region as the back sheet layer of the photovoltaic module and the cell layer coupled to a lower portion of the back sheet layer, the sensor device being positioned above the transfer device.

4. The partial dismantling device for the photovoltaic module according to claim 1,
further comprising a sensor device for distinguishing grinding heights of the photovoltaic module, wherein the sensor device defines the grinding region by measuring a height of a lower glass substrate among the element layers of the photovoltaic module.

5. The partial dismantling device for the photovoltaic module according to claim 1,
wherein a cooler cools down frictional heat generated when the grind device grinds the element layers of the grinding region into the particles of collectible forms.

6. The partial dismantling device for the photovoltaic module according to claim 1,
wherein the cell layer has an unevenly shaped surface, and the first grinder simultaneously grinds the back sheet layer and a part of the EVA film in contact with the lower portion of the back sheet layer, so that no part of the back sheet layer remains in recessed portions of the cell layer.

7. The partial dismantling device for the photovoltaic module according to claim 1,
further comprising a sensor device to set a lower surface of the first grinder and a lower surface of the second grinder to be spaced apart by a distance smaller than a height of the cell layer.

8. The partial dismantling device for the photovoltaic module according to claim 1,
wherein the second grinder grinds the at least a part of the cell layer to allow collection of a mix of the copper ribbon particles immersed in the cell layer, cell integrated element particles, and the EVA film particles in the cell layer.

9. The partial dismantling device for the photovoltaic module according to claim 1,
further comprising a classifying device for classifying the particles pulverized by the second grinder, wherein the classifying device comprises:
a first cyclone for extracting the EVA film particles among the particles inhaled by the second inhaler, and discharging the copper ribbon particles and the cell integrated element particles; and
a second cyclone connected to an outlet of the first cyclone for classifying the copper ribbon particles and the cell integrated element particles.

10. The partial dismantling device for the photovoltaic module of according to claim 1,
further comprising a sensor device for distinguishing grinding heights of the photovoltaic module, wherein the sensor device measures a height of the glass substrate of the photovoltaic module,
the first grinder grinds the EVA film arranged on the glass substrate to leave the glass substrate.

11. The partial dismantling device for the photovoltaic module according to claim 1, further comprising a sensor device,
wherein the sensor device defines a first height as a height from a top surface of the transfer device to a top surface of the cell layer, and
wherein the sensor device sets the first grinder not to grind a cell integrated element corresponding to the cell integrated element particles, and a copper ribbon corresponding to the copper ribbon particles, while removing a portion of the EVA film on an upper part of the cell layer, and
wherein the sensor device defines a second height as a height from the top surface of the transfer device to a top surface of the glass substrate, and
wherein the sensor device sets the second height such that a predefined thickness of a lower portion of the EVA film is left on the upper part of the cell layer to protect the glass substrate.

* * * * *